United States Patent
Wang et al.

(10) Patent No.: US 11,637,197 B2
(45) Date of Patent: Apr. 25, 2023

(54) EPITAXIAL STRUCTURE OF GAN-BASED RADIO FREQUENCY DEVICE BASED ON SI SUBSTRATE AND ITS MANUFACTURING METHOD

(71) Applicants: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangdong (CN)

(72) Inventors: Hong Wang, Guangdong (CN); Quanbin Zhou, Guangdong (CN)

(73) Assignees: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangdong (CN)

( * ) Notice: Subject to any disclaimer, the term of this patent is extended or adjusted under 35 U.S.C. 154(b) by 307 days.

(21) Appl. No.: 17/253,626

(22) PCT Filed: Sep. 16, 2019

(86) PCT No.: PCT/CN2019/106032
§ 371 (c)(1),
(2) Date: Dec. 18, 2020

(87) PCT Pub. No.: WO2020/015764
PCT Pub. Date: Jan. 23, 2020

(65) Prior Publication Data
US 2021/0265493 A1    Aug. 26, 2021

(30) Foreign Application Priority Data
Jul. 17, 2018   (CN) .......................... 201810784434.3

(51) Int. Cl.
*H01L 29/778* (2006.01)
*H01L 21/02* (2006.01)
(Continued)

(52) U.S. Cl.
CPC ...... *H01L 29/7783* (2013.01); *H01L 21/0254* (2013.01); *H01L 21/0257* (2013.01);
(Continued)

(58) Field of Classification Search
CPC ........... H01L 29/7783; H01L 21/02381; H01L 21/02458; H01L 21/02505; H01L 21/0254;
(Continued)

(56) References Cited

U.S. PATENT DOCUMENTS

2012/0025202 A1    2/2012   Makabe et al.

FOREIGN PATENT DOCUMENTS

| CN | 105390541 | 3/2016 |
| CN | 106711212 | 5/2017 |

(Continued)

OTHER PUBLICATIONS

"International Search Report (Form PCT/ISA/210)"of PCT/CN2019/106032, dated Nov. 29, 2019, with English translation thereof, pp. 1-4.

*Primary Examiner* — Michelle M Iacoletti
*Assistant Examiner* — Daniel Hyun Suh
(74) *Attorney, Agent, or Firm* — JCIP Global Inc.

(57) ABSTRACT

An epitaxial structure of a GaN-based radio frequency device based on a Si substrate and a manufacturing method thereof are provided. The epitaxial structure is composed of a Si substrate (1), an AlN nucleation layer (2), AlGaN buffer layers (3, 4, 5), a GaN:Fe/GaN high-resistance layer (6), a GaN superlattice layer (7), a GaN channel layer (8), an AlGaN barrier layer (9) and a GaN cap layer (10) which are (Continued)

stacked in turn from bottom to top, wherein the GaN:Fe/GaN high-resistance layer (6) is composed of an intentional Fe-doped GaN layer and an unintentional doped GaN layer which are alternately connected; the GaN superlattice layer (7) is composed of a low-pressure/low V/III ratio GaN layer and a high-pressure/high V/III ratio GaN layer which are periodically and alternately connected.

10 Claims, 5 Drawing Sheets

(51) Int. Cl.
  *H01L 29/20*  (2006.01)
  *H01L 29/205* (2006.01)
  *H01L 29/207* (2006.01)
(52) U.S. Cl.
  CPC .... *H01L 21/0262* (2013.01); *H01L 21/02381* (2013.01); *H01L 21/02458* (2013.01); *H01L 21/02505* (2013.01); *H01L 29/2003* (2013.01); *H01L 29/205* (2013.01); *H01L 29/207* (2013.01)

(58) Field of Classification Search
  CPC ............. H01L 21/0257; H01L 21/0262; H01L 29/2003; H01L 29/205; H01L 29/207
  See application file for complete search history.

(56) References Cited

FOREIGN PATENT DOCUMENTS

| | | | |
|---|---|---|---|
| CN | 107068750 | 8/2017 | |
| CN | 108695385 | 10/2018 | |
| KR | 2015000752 A | * 1/2015 | ......... H01L 29/2003 |

* cited by examiner

| 1 |
|---|

FIG. 1

| 2 |
|---|
| 1 |

FIG. 2

| 5 |
|---|
| 4 |
| 3 |
| 2 |
| 1 |

FIG. 3

| 6 |
|---|
| 5 |
| 4 |
| 3 |
| 2 |
| 1 |

EPITAXIAL STRUCTURE OF GAN-BASED RADIO FREQUENCY DEVICE BASED ON SI SUBSTRATE AND ITS MANUFACTURING METHOD

CROSS-REFERENCE TO RELATED APPLICATION

This application is a 371 of international application of PCT application serial no. PCT/CN2019/106032, filed on Sep. 16, 2019, which claims the priority benefit of China application no. 201810784434.3, filed on Jul. 17, 2018. The entirety of each of the above mentioned patent applications is hereby incorporated by reference herein and made a part of this specification.

BACKGROUND

Technical Field

The present invention relates to semiconductor devices, in particular to an epitaxial structure of a GaN-based radio frequency device based on a Si substrate and its manufacturing method. The epitaxial structure of the GaN-based radio frequency device may be used in fields such as high-frequency, high-power wireless communication, radar and so on.

Description of Related Art

With the development of modern weaponry and aerospace, nuclear power, communication technology, automotive electronics, and switching power supplies, higher requirements are placed on the performance of semiconductor devices. As a typical representative of wide-bandgap semiconductor materials, GaN-based material has the characteristics such large width of bandgap, high electron saturation drift velocity, high critical breakdown field strength, high thermal conductivity, good stability, corrosion resistance, radiation resistance and so on, and may be used for manufacturing high-temperature, high-frequency and high-power electronic devices. In addition, GaN also has excellent electronic properties, and may form a modulation doped AlGaN/GaN heterostructure, with AlGaN. This structure, at room temperature, may obtain an electron mobility of higher than 1500 cm$^2$/Vs, a peak electron velocity of up to $3\times10^7$ cm/s, and a saturated electron velocity of $2\times10^7$ cm/s, and obtain a higher two-dimensional electron gas density than the second-generation compound semiconductor heterostructure. It is known as the ideal material for the development of microwave power devices. Therefore, the high electron mobility transistor HEMT based on AlGaN/GaN heterojunction has a very good application prospect in microwave high power devices.

SiC and Si are the main substrate materials of GaN-based microwave power devices, wherein the SiC substrate material has characteristics such as small lattice mismatch, low dislocation density, and good thermal conductivity and so on, and the GaN material grown on the SiC substrate has high crystal quality and low leakage current. At the same time, the self-heating effect of the high power density GaN-based microwave power devices can be effectively reduced due to the good thermal conductivity of the SiC substrate. Therefore, SiC is the main substrate material for manufacturing high-frequency, high-power GaN-based microwave power devices. The main constraint of SiC substrate materials is the high cost, which leads to that the GaN-based microwave power based on SiC substrates can only be used currently in military fields such as active phased array radar, satellite and so on.

Compared with SiC substrates, Si substrates have advantages in low cost and large wafer preparation. Large-size (>12-inch) Si substrate preparation technology is very mature. At the same time, GaN materials based on Si substrates is compatible with the Si process to achieve large-scale mass production. Therefore, in commercial fields with low-cost and high-capacity requirements such as communication satellites, low-power devices, and cable TV, GaN materials based on Si substrates are more competitive. At present, the main difficulty in growing flat GaN-based epitaxial materials on the large-size Si substrates is that due to the huge lattice mismatch (−17%) and thermal mismatch (116%) between GaN and Si substrates, resulting in high wafer warpage, poor material uniformity and poor GaN crystal quality, so the defect density (including dislocations and background impurities) is high, and then the current leakage of the material is high, causing reliability problems of the device.

SUMMARY

Technical Problem

The objective of the present invention is to overcome the defects of the prior art described above, and from the viewpoint of optimization of the longitudinal structure of the device, to propose an epitaxial structure of a GaN-based radio frequency device based on a Si substrate and its manufacturing method, to improve the crystal quality and performance of the epitaxial material, to reduce the current leakage of the material, to reduce the process difficulty, and to improve the reliability of the device.

Technical Solution

The object of the present invention is achieved by at least one of the following technical solutions.

An epitaxial structure of a GaN-based radio frequency device based on a Si substrate, wherein the epitaxial structure of the GaN-based radio frequency device is composed of a Si substrate, an MN nucleation layer, an AlGaN buffer layer, a GaN:Fe/GaN high-resistance layer, a GaN superlattice layer, a GaN channel layer, an AlGaN barrier layer and a GaN cap layer which are stacked in turn from bottom to top; wherein the GaN:Fe/GaN high-resistance layer is composed of an intentional Fe-doped GaN layer and an unintentional doped GaN layer which are alternately connected; each of the intentional Fe-doped GaN layer and the unintentional doped GaN layer has a thickness of 100 nm to 200 nm; the GaN superlattice layer is composed of a low-pressure/low V/III ratio GaN layer and a high-pressure/high V/III ratio GaN layer which are periodically and alternately connected, and each of the low-pressure/low V/III ratio GaN layer and the high-pressure/high V/III ratio GaN layer has a thickness of 20 nm to 50 nm.

To further achieve the object of the present invention, preferably, a repetition period of the low-pressure/low V/III ratio GaN layer and the high-pressure/high V/III ratio GaN layer is 3 to 5 cycles.

Preferably, a repetition period of the intentional Fe-doped GaN layer and the unintentional doped GaN layer is 3 to 5 cycles, and a doping concentration of Fe impurities in the intentional Fe-doped GaN layer is 1E19 cm$^{-3}$-1E20 cm$^{-3}$.

Preferably, the AlGaN buffer layer has a total of three layers, wherein a molar content percentage of an Al element of each of the three layers from bottom to top decreases in turn, and is in the range of 20% to 70%; a thickness of each of the three layers increases in turn, and is in the range of 200 nm to 800 nm.

Preferably, the Si substrate has a circular shape and a diameter of 6 inches to 10 inches.

Preferably, a thickness of the Si substrate, a thickness of the AlN nucleation layer, a thickness of the AlGaN buffer layer, a thickness of the GaN channel layer, a thickness of the AlGaN barrier layer and a thickness of the GaN cap layer are respectively 0.5 mm to 2 mm, 0.2 μm to 1 μm, 600 nm to 2400 nm, 100 nm to 500 nm, 10 nm to 30 nm and 2 nm to 5 nm.

Manufacturing method of the epitaxial structure of the GaN-based radio frequency device based on the Si substrate, wherein the method comprises the steps of:

1) Putting the Si substrate into a metal organic chemical vapor deposition equipment, and annealing a surface of the Si substrate in a reaction chamber;

2) Epitaxially growing an AlN nucleation layer on the substrate;

3) Epitaxially growing AlGaN buffer layers on the basis of the AlN nucleation layer, wherein the AlGaN buffer layers have a total of three layers, wherein an Al element molar content percentage of each of the three layers decreases in turn, and is in the range of 20%~70%; thickness of each of the three layers increases in turn, and is in the range of 200 nm to 800 nm;

4) Repeating the following steps 4a) and 4b) multiple times to epitaxially growing GaN:Fe/GaN high-resistance layer on the basis of AlGaN buffer layer;

4a) Using $Cp_2Fe$ as a Fe doping source to grow an intentional Fe-doped GaN layer, the doping concentration of Fe impurities in the intentional Fe-doped GaN layer is 1E19 $cm^{-3}$-1E20 $cm^{-3}$, and a thickness of the intentional Fe-doped GaN layer is 100 nm to 200 nm;

4b) Growing an unintentional doped GaN layer on the intentional Fe-doped GaN layer, without introducing $Cp_2Fe$, wherein the thickness of the unintentional doped GaN layer is 100 nm to 200 nm;

5) Repeating the following steps 5a) and 5b) multiple times, and epitaxially growing a GaN superlattice layer on the GaN:Fe/GaN high-resistance layer;

5a) Growing a low-pressure/low V/III ratio GaN layer under low-pressure and low V/III ratio growth conditions, wherein a growth pressure is 50 Torr to 100 Torr, a V/III ratio is lesser than 50, and a thickness of the low-pressure/low V/III ratio GaN layer is 20 nm to 50 nm;

5b) Growing a high-pressure/high V/III ratio GaN layer under high-pressure and high V/III ratio growth conditions, wherein a growth pressure is 300 Torr to 400 Torr, a V/III ratio is greater than 110, and a thickness of the high-pressure/high V/III ratio GaN layer is 20 nm-50 nm;

6) Epitaxially growing a GaN channel layer;

7) Epitaxially growing an AlGaN barrier layer;

8) Epitaxially growing a GaN cap layer.

Preferably, a temperature of the annealing process in step 1) is higher than 1100 degrees Celsius and a time of the annealing process in step 1) is longer than 10 minutes.

Preferably, the MN nucleation layer in step 2) provides a nucleation node for subsequent growth, and a temperature is higher than 1200 degrees Celsius.

Preferably, a molar content percentage of an Al element in the AlGaN barrier layer in step 7) is 20% to 30%.

Advantageous Effect

Compared with the prior art, the present invention has following advantages and technical effects:

The epitaxy is the epitaxial structure of the GaN-based radio frequency device based on the Si substrate. By optimizing the process conditions, on the one hand, the material failure is suppressed, and on the other hand, the film quality is improved. The epitaxy prepared on the large-sized Si substrate has characteristics of high crystal quality, good confinement of the channel carrier, low leakage current. The device prepared by the epitaxial structure of the present invention has high breakdown voltage, high current density, low off-state leakage, and excellent pinch-off characteristics, and has small performance degradation at high temperature. The epitaxial structure of the GaN-based radio frequency device based on the Si substrate has a simple manufacturing process and good repeatability, and is suitable for high-frequency, high-power wireless communication, radar and other applications.

BRIEF DESCRIPTION OF THE DRAWINGS

The figures show the followings: Si substrate 1, MN nucleation layer 2, first AlGaN buffer layer 3, second AlGaN buffer layer 4, third AlGaN buffer layer 5, GaN:Fe/GaN high-resistance layer 6, GaN superlattice layer 7, GaN channel layer 8, AlGaN barrier layer 9, GaN cap layer 10.

DESCRIPTION OF THE EMBODIMENTS

The specific implementation of the present invention is further described below with reference to the accompanying drawings and embodiment, but the implementation and protection of the present invention are not limited thereto. It should be noted that, if any process or process parameters are not described in detail below, it can be achieved with reference to the prior art by those skilled in the art.

Figure 8:
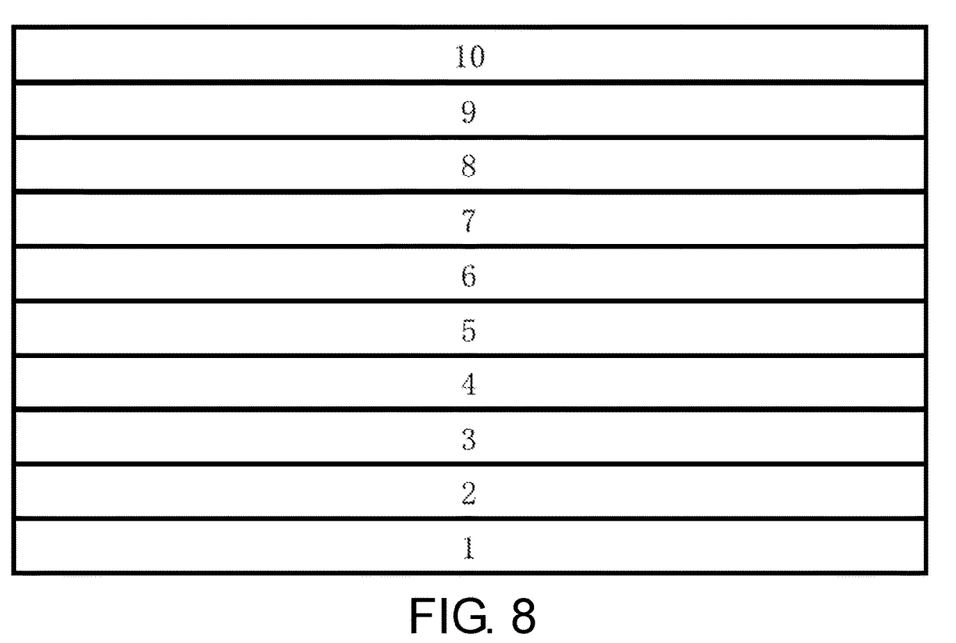

Referring to FIG. 8, an epitaxial structure of a GaN-based high-pressure HEMT device based on a Si substrate, wherein the epitaxial structure of the GaN-based radio frequency device comprises, from bottom to top, a Si substrate 1, an AlN nucleation layer 2, a first AlGaN buffer layer 3, a second AlGaN buffer layer 4, a third AlGaN buffer layer 5, a GaN:Fe/GaN high-resistance layer 6, a GaN superlattice layer 7, a GaN channel layer 8, an AlGaN barrier layer 9 and a GaN cap layer 10; wherein the GaN:Fe/GaN high-resistance layer 6 is composed of an intentional Fe-doped GaN layer and an unintentional doped GaN layer which are alternately connected, and the GaN superlattice layer 7 is composed of a low-pressure/low V/III ratio GaN layer and a high-pressure/high V/III ratio GaN layers which are periodically and alternately connected. Low V/III ratio means low $NH_3$ flow rate and high TMGa flow rate. Conversely, high V/III ratio means high $NH_3$ flow rate and low TMGa flow rate.

Embodiment 1

The Si substrate 1 has a circular shape and a diameter of 8 inches. The thicknesses of the Si substrate, the AlN nucleation layer, the GaN channel layer, the AlGaN barrier layer, and the GaN cap layer are 1 mm, 0.5 μm, 300 nm, 20 nm, and 3 nm, respectively.

The first AlGaN buffer layer 3, the second AlGaN buffer layer 4 and the third AlGaN buffer layer 5 have a total of three layers, wherein an Al element molar content of each of the three layers from bottom to top decreases in turn, which is 0.7, 0.5 and 0.3 respectively; the thickness of each of the three layers increases in turn, which is 300 nm, 500 nm and 700 nm respectively.

The GaN:Fe/GaN high-resistance layer 6 is composed of the intentional Fe-doped GaN layer and the unintentional doped GaN layer which are alternately connected. Each of the intentional Fe-doped GaN layer and the unintentional doped GaN layer has a thickness of 100 nm and a period of 3 cycles, and a doping concentration of Fe impurities in the intentional Fe-doped GaN layer is $1E19\ cm^{-3}$.

The GaN superlattice layer 7 is composed of the low-pressure/low V/III ratio GaN layer and the high-pressure/high V/III ratio GaN layer which are periodically and alternately connected, wherein the low-pressure/low V/III ratio GaN layer is grown under low-pressure and low V/III ratio conditions and the high-pressure/high V/III ratio GaN layer is grown under high-pressure and high V/III ratio conditions, and each of the low-pressure/low V/III ratio GaN layer and the high-pressure/high V/III ratio GaN layer has a thickness of 25 nm, and a period of 5 cycles.

Figure 1:
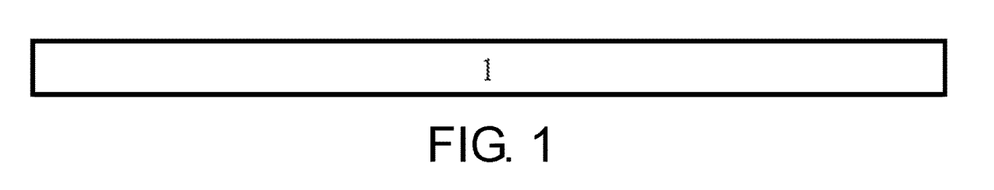
FIGS. 1 to 8 are schematic views of showing a preparation process of an epitaxial structure of a GaN-based radio frequency device based on a Si substrate in an embodiment of the present invention.

As shown in FIGS. 1 to 8, a manufacturing method of the epitaxial structure of the GaN-based radio frequency device based on the Si substrate comprises the following steps:

Step 1: Put the Si substrate 1 into a metal organic chemical vapor deposition (MOCVD) equipment; a surface of the Si substrate 1 is annealed in a reaction chamber at a temperature of 1200 degrees Celsius for 15 minutes; the structure obtained is shown in FIG. 1.

Figure 2:
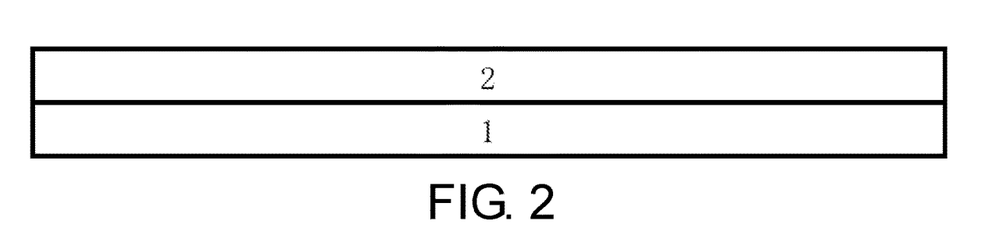

Step 2: The MN nucleation layer 2 is epitaxially grown on the Si substrate 1; the structure obtained is shown in FIG. 2.

Figure 3:
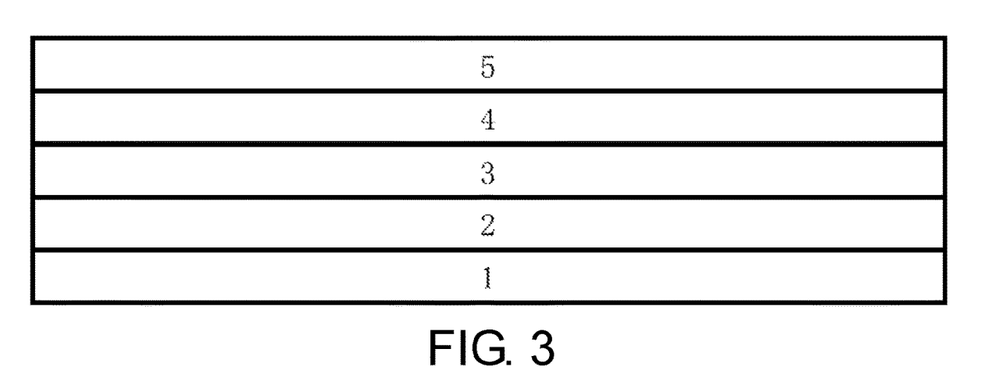

Step 3: The first AlGaN buffer layer 3, the second AlGaN buffer layer 4, and the third AlGaN buffer layer 5 are epitaxially grown in turn on the MN nucleation layer 2. There are three layers in total, and Al element molar contents of the three layers decreases in turn, and values of the Al element molar contents are 0.7, 0.5, 0.3 respectively. Thickness of single layer increases in turn and has values of 300 nm, 500 nm and 700 nm respectively; the structure obtained is shown in FIG. 3.

Figure 4:
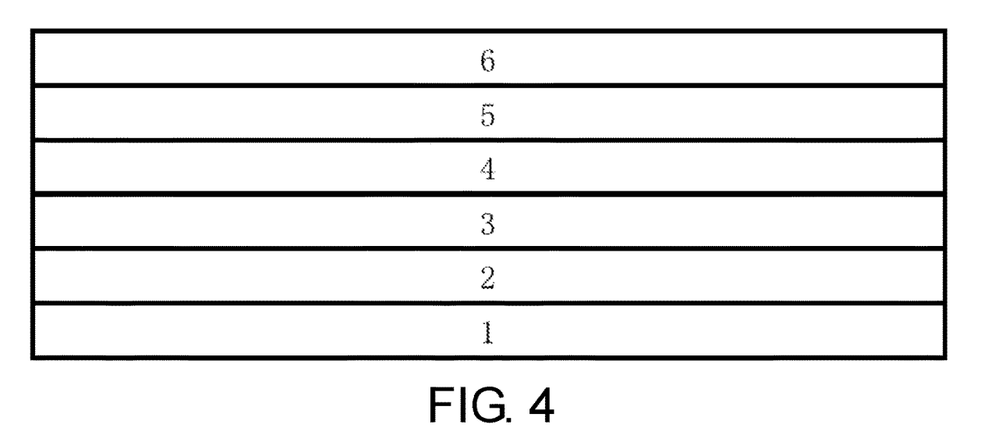
Figure 9:
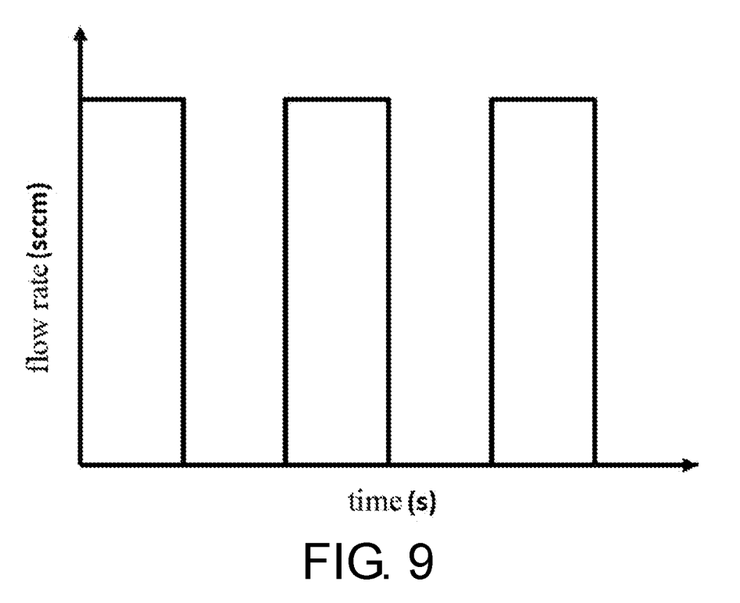
FIG. 9 is a flow rate variation curve of $Cp_2Fe$ in GaN:Fe/GaN high-resistance layer in embodiment 1 of the present invention.

Step 4: Repeat the following steps 4a) and 4b) a total of 3 times to epitaxially grow the GaN:Fe/GaN high-resistance layer 6 on the basis of the third AlGaN buffer layer 5. The structure obtained is shown in FIG. 4. FIG. 9 is a flow rate variation curve of $Cp_2Fe$ in the GaN:Fe/GaN high-resistance layer in embodiment 1 of the present invention. The flow rate of $Cp_2Fe$ changes periodically, and the doping concentration of Fe impurities also changes periodically. When growing the intentional Fe-doped GaN layer, $Cp_2Fe$ is introduced, and the intentional Fe-doped GaN layer has a high resistance. When growing the unintentional doped GaN layer, $Cp_2Fe$ is not introduced, the flow rate of $Cp_2Fe$ is zero; the doping concentration of Fe impurities is zero; the unintentional doped GaN layer has a high crystal quality. The two grow alternately to obtain the GaN:Fe/GaN high-resistance layer 6 having high resistance and crystal quality. The flow rate variation curve of $Cp_2Fe$ in FIG. 9 in this embodiment can be obtained from a monitoring data of the $Cp_2Fe$ mass flow meter on the equipment.

4a) Use ferrocene ($Cp_2Fe$) as a Fe doping source to grow the intentional Fe-doped GaN layer, wherein a doping concentration of Fe impurity of $1E19\ cm^{-3}$ and a thickness of the intentional Fe-doped GaN layer is 100 nm.

4b) The unintentional doped GaN layer is grown on the intentional Fe-doped GaN layer without introducing $Cp_2Fe$, wherein a thickness of the unintentional doped GaN layer is 100 nm.

Figure 5:
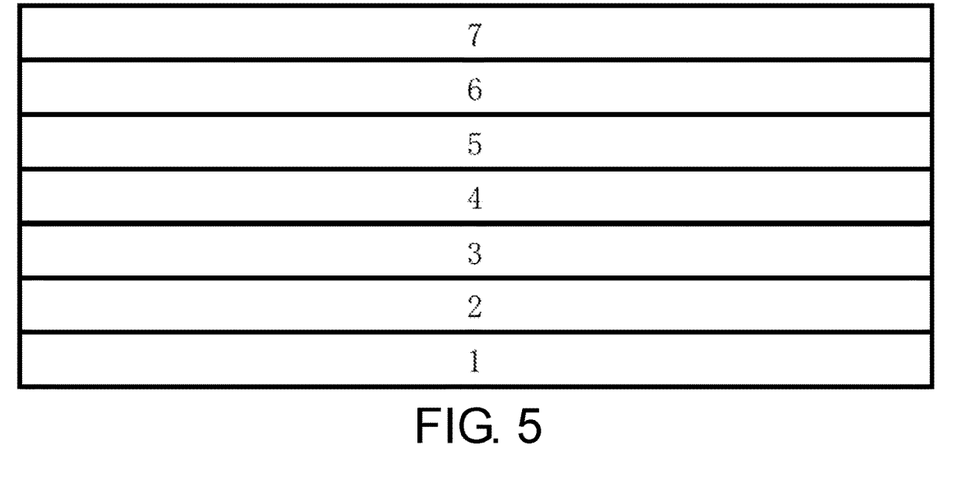
Figure 10:
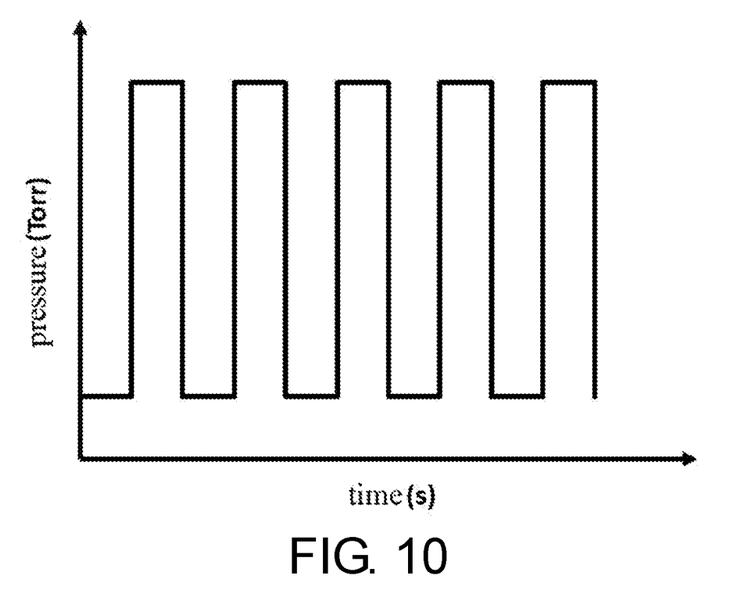
FIG. 10 is a pressure variation curve of the GaN superlattice layer in embodiment 1 of the present invention.
Figure 11:
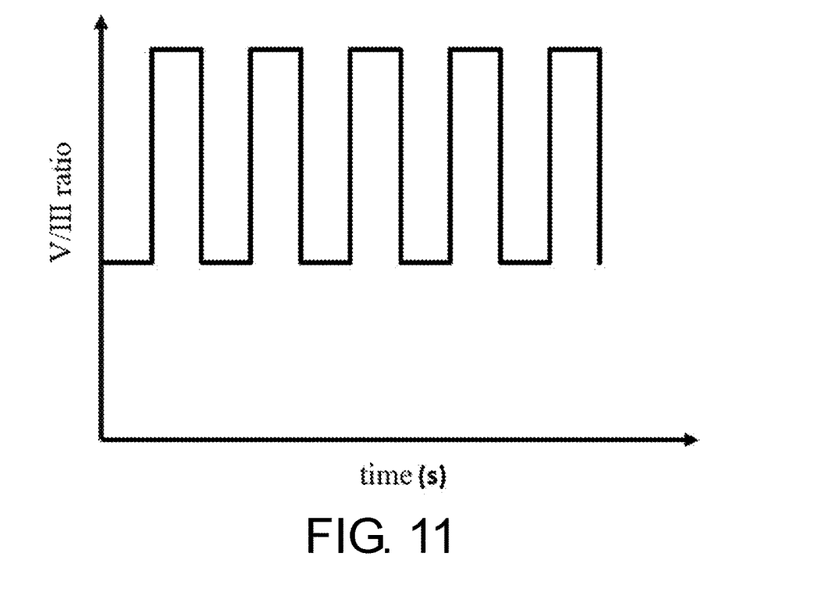
FIG. 11 is a V/III ratio variation curve of the GaN superlattice layer in embodiment 1 of the present invention.

Step 5: Repeat the following steps 5a) and 5b) 5 times to epitaxially grow the GaN superlattice layer 7 on the GaN:Fe/GaN high-resistance layer 6. The structure obtained is shown in FIG. 5. FIGS. 10 and 11 are variation curves of the pressure and the V/III ratio of the GaN superlattice layer in the embodiment 1. The pressure and the V/III ratio change periodically. When growing the low-pressure/low V/III ratio GaN layer, the growth pressure is low and the V/III ratio is low. When growing the high-pressure/high V/III ratio GaN layer, the growth pressure is high and the V/III ratio is high. The two grow alternately to obtain the GaN superlattice layer 7. The pressure variation curve in FIG. 10 in this embodiment can be obtained from the monitoring data of the pressure controller on the equipment. The V/III variation curve in FIG. 11 in this embodiment can be obtained from a monitoring data of the ammonia flow meter on the equipment.

5a) The low-pressure/low V/III ratio GaN layer is grown under low-pressure and low V/III ratio growth conditions, wherein a growth pressure is 50 Torr, a V/III ratio is 50, and a thickness of the low-pressure/low V/III ratio GaN layer is 25 nm;

5b) The high-pressure/high V/III ratio GaN layer is grown under high-pressure and high V/III ratio growth conditions, wherein a growth pressure is 300 Torr, a V/III ratio is 110, and a thickness of the high-pressure/high V/III ratio GaN layer is 25 nm.

Figure 6:
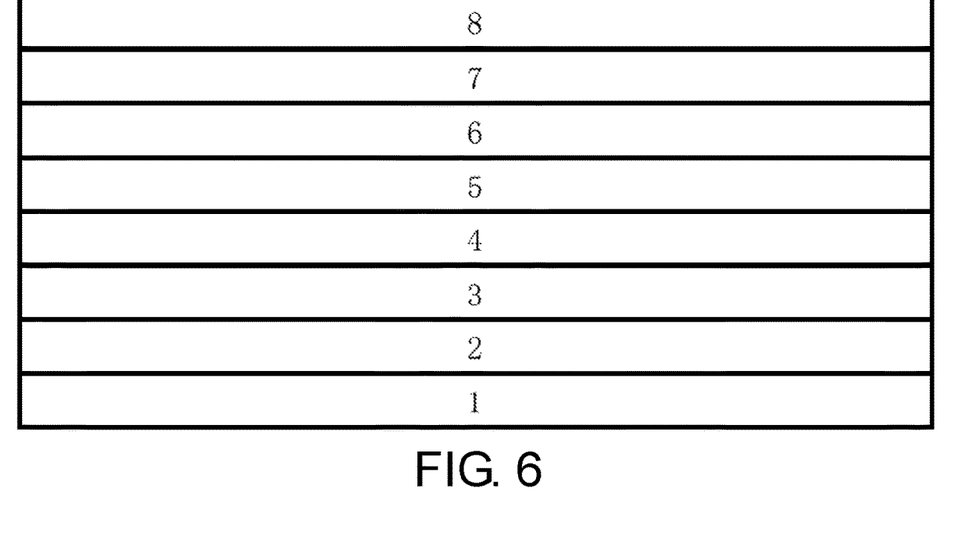

Step 6: The GaN channel layer 8 is epitaxially grown on the GaN superlattice layer 7, wherein a thickness of the GaN channel layer 8 is 300 nm; the structure obtained is shown in FIG. 6.

Figure 7:
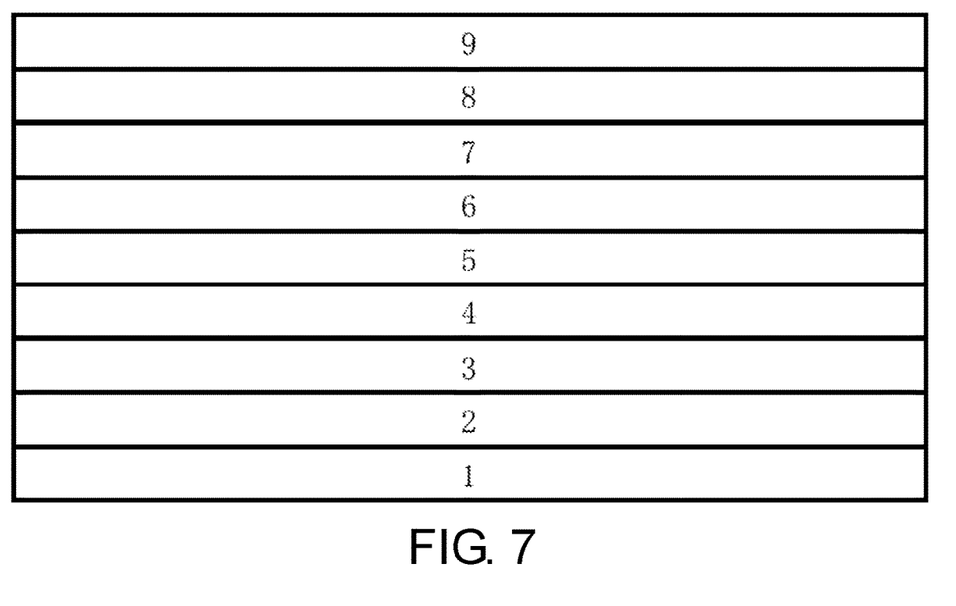

Step 7: The AlGaN barrier layer 9 is epitaxially grown on the GaN channel layer 8, wherein a molar content of an Al element in the AlGaN barrier layer 9 is 25% and a thickness of the AlGaN barrier layer 9 is 25 nm; the structure obtained is shown in FIG. 7.

Step 8. The GaN cap layer 10 is epitaxially grown on the AlGaN barrier layer 9, wherein a thickness of the GaN cap layer 10 is 3 nm. The structure obtained is shown in FIG. 8, which is the epitaxial structure of the GaN-based high-pressure HEMT device based on the Si substrate.

Figure 12:
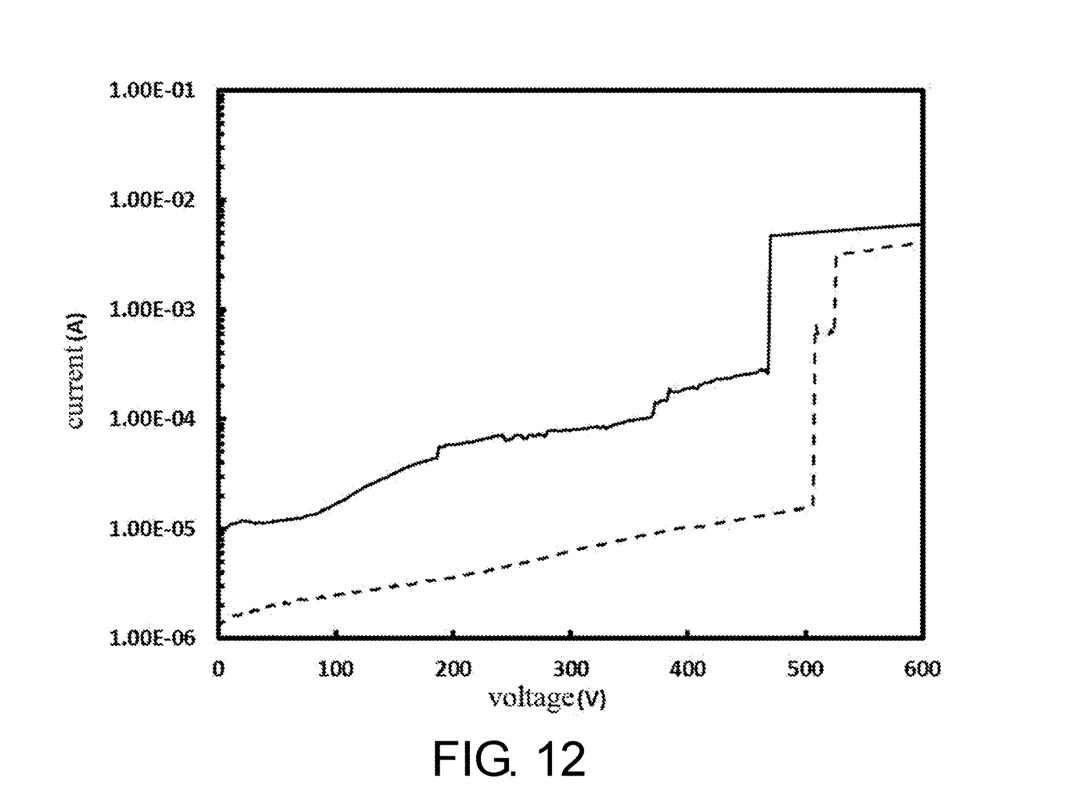
FIG. 12 is current leakage curves of source and drain electrodes of the epitaxial structures of the present invention and of the prior art.

After the electrode was prepared on the sample described in embodiment 1, the off-state I-V curve of the radio frequency device was tested using the Agilent B1505A source meter, and the results in FIG. 12 were obtained. In FIG. 12, the abscissa is voltage and the unit is V, and the ordinate is leakage current and the unit is A. The solid line is the leakage current curve of the existing epitaxial structure, and the dashed line is the leakage current curve of the epitaxial structure of the present invention. It can be seen from the figure that, compared to the existing epitaxial structure, the sample of this embodiment has a higher breakdown voltage which is greater than 510V, 50V higher than that of the existing epitaxial structure; and the off-state leakage of the sample of this embodiment is smaller and is less than $10^{-6}$ A/mm, which is an order of magnitude lower than that of the existing epitaxial structure, and the pinch-off characteristics of the sample of this embodiment are better.

Embodiment 2

The Si substrate 1 has a circular shape and a diameter of 8 inches. The thicknesses of the Si substrate, the AlN nucleation layer, the GaN channel layer, the AlGaN barrier layer, and the GaN cap layer are 1 mm, 0.5 μm, 300 nm, 30 nm, and 5 nm, respectively.

The first AlGaN buffer layer 3, the second AlGaN buffer layer 4 and the third AlGaN buffer layer 5 have a total of three layers, wherein an Al element molar content of each of the three layers from bottom to top decreases in turn, which is 0.7, 0.5 and 0.3 respectively; thickness of each of the three layers increases in turn, which is 300 nm, 500 nm and 700 nm respectively.

The GaN:Fe/GaN high-resistance layer 6 is composed of the intentional Fe-doped GaN layer and the unintentional doped GaN layer which are alternately connected. Each of the intentional Fe-doped GaN layer and the unintentional doped GaN layer has a thickness of 150 nm and a period of 5 cycles, and a doping concentration of Fe impurities in the intentional Fe-doped GaN layer is 5E19 $cm^{-3}$.

The GaN superlattice layer 7 is composed of a low-pressure/low V/III ratio GaN layer and a high-pressure/high V/III ratio GaN layer which are periodically and alternately connected, wherein the low-pressure/low V/III ratio GaN layer is grown under low-pressure and low V/III ratio conditions and the high-pressure/high V/III ratio GaN layer is grown under high-pressure and high V/III ratio conditions, and each of the low-pressure/low V/III ratio GaN layer and the high-pressure/high V/III ratio GaN layer has a thickness of 25 nm, and a period of 5 cycles.

As shown in FIGS. 1 to 8, a manufacturing method of the epitaxial structure of the GaN-based radio frequency device based on the Si substrate comprises the following steps:

Step 1: Put the Si substrate 1 into a metal organic chemical vapor deposition (MOCVD) equipment; a surface of the Si substrate 1 is annealed in a reaction chamber at a temperature of 1200 degrees Celsius for 15 minutes.

Step 2: The AlN nucleation layer 2 is epitaxially grown on the Si substrate 1.

Step 3: The AlGaN buffer layers 3-5 are epitaxially grown on the AlN nucleation layer 2. There are three layers in total, and Al element molar contents of the three layers decreases in turn, and values of the Al element molar contents are 0.7, 0.5, 0.3 respectively. Thickness of single layer increases in turn and has values of 300 nm, 500 nm and 700 nm respectively.

Step 4: Repeat the following steps 4a) and 4b) a total of 5 times to epitaxially grow GaN:Fe/GaN high-resistance layer 6 on the basis of the AlGaN buffer layers 3-5.

4a) Use ferrocene $Cp_2Fe$ as a Fe doping source to grow the intentional Fe-doped GaN layer, wherein a doping concentration of Fe impurity of 5E19 $cm^{-3}$ and a thickness of the intentional Fe-doped GaN layer is 150 nm.

4b) The unintentional doped GaN layer is grown on the intentional Fe-doped GaN layer without introducing $Cp_2Fe$, wherein a thickness of the unintentional doped GaN layer is 150 nm.

Step 5: Repeat the following steps 5a) and 5b) 5 times to epitaxially grow the GaN superlattice layer 7 on the GaN:Fe/GaN high-resistance layer 6.

5a) The low-pressure/low V/III ratio GaN layer is grown under low-pressure and low V/III ratio growth conditions, wherein a growth pressure is 50 Torr, a V/III ratio is 50, and a thickness of the low-pressure/low V/III ratio GaN layer is 25 nm.

5b) The high-pressure/high V/III ratio GaN layer is grown under high-pressure and high V/III ratio growth conditions, wherein a growth pressure is 300 Torr, a V/III ratio is 110, and a thickness of the high-pressure/high V/III ratio GaN layer is 25 nm.

Step 6: The GaN channel layer 8 is epitaxially grown on the GaN superlattice layer 7, wherein a thickness of the GaN channel layer 8 is 300 nm.

Step 7: The AlGaN barrier layer 9 is epitaxially grown on the GaN channel layer 8, wherein a molar content of an Al element in the AlGaN barrier layer 9 is 25% and a thickness of the AlGaN barrier layer 9 is 25 nm.

Step 8. The GaN cap layer 10 is epitaxially grown on the AlGaN barrier layer 9, wherein a thickness of the GaN cap layer 10 is 3 nm.

Comparing embodiment 2 with embodiment 1, the GaN:Fe/GaN high-resistance layer 6 in the embodiment 2 has more cycles and a larger thickness and a larger doping concentration of Fe impurities, so the off-state leakage in embodiment 2 is slightly lower than that in embodiment 1. The breakdown voltage in embodiment 2 is slightly higher, which is 600V, and the off-state leakage in embodiment 2 is $8 \times 10^{-7}$ A/mm.

Embodiment 3

The Si substrate 1 has a circular shape and a diameter of 8 inches. The thicknesses of the Si substrate, the AlN nucleation layer, the GaN channel layer, the AlGaN barrier layer, and the GaN cap layer are 1 mm, 0.5 μm, 300 nm, 15 nm, and 2 nm, respectively.

The AlGaN buffer layers 3-5 have a total of three layers, wherein an Al element molar content of each of the three layers from bottom to top decreases in turn, which is 0.7, 0.5 and 0.3 respectively; thickness of each of the three layers increases in turn, which is 300 nm, 500 nm and 700 nm respectively.

The GaN:Fe/GaN high-resistance layer 6 is composed of the intentional Fe-doped GaN layer and the unintentional doped GaN layer which are alternately connected. Each of the intentional Fe-doped GaN layer and the unintentional doped GaN layer has a thickness of 100 nm and a period of 3 cycles, and a doping concentration of Fe impurities in the intentional Fe-doped GaN layer is 1E19 $cm^{-3}$.

The GaN superlattice layer 7 is composed of the low-pressure/low V/III ratio GaN layer and the high-pressure/high V/III ratio GaN layer which are periodically and alternately connected, wherein the low-pressure/low V/III ratio GaN layer is grown under low-pressure and low V/III ratio conditions and the high-pressure/high V/III ratio GaN layer is grown under high-pressure and high V/III ratio conditions, and each of the low-pressure/low V/III ratio GaN layer and the high-pressure/high V/III ratio GaN layer has a thickness of 50 nm, and a period of 5 cycles.

As shown in FIGS. 1 to 8, a manufacturing method of the epitaxial structure of the GaN-based radio frequency device based on the Si substrate comprises the following steps:

Step 1: Put the Si substrate 1 into a metal organic chemical vapor deposition (MOCVD) equipment; a surface of the Si substrate 1 is annealed in a reaction chamber at a temperature of 1200 degrees Celsius for 15 minutes.

Step 2: The MN nucleation layer 2 is epitaxially grown on the Si substrate 1.

Step 3: The first AlGaN buffer layer 3, the second AlGaN buffer layer 4, and the third AlGaN buffer layer 5 are epitaxially grown on the MN nucleation layer 2. There are three layers in total, and Al element molar contents of the three layers decreases in turn, and values of the Al element molar contents are 0.7, 0.5, 0.3 respectively. Thickness of single layer increases in turn and has values of 300 nm, 500 nm and 700 nm respectively.

Step 4: Repeat the following steps 4a) and 4b) a total of 3 times to epitaxially grow GaN:Fe/GaN high-resistance layer 6 on the basis of the third AlGaN buffer layer 5.

4a) Use ferrocene $Cp_2Fe$ as a Fe doping source to grow the intentional Fe-doped GaN layer, wherein a doping concentration of Fe impurity of $1E19$ $cm^{-3}$ and a thickness of the intentional Fe-doped GaN layer is 150 nm.

4b) The unintentional doped GaN layer is grown on the intentional Fe-doped GaN layer without introducing $Cp_2Fe$, wherein a thickness of the unintentional doped GaN layer is 150 nm.

Step 5: Repeat the following steps 5a) and 5b) 5 times to epitaxially grow the GaN superlattice layer 7 on the GaN: Fe/GaN high-resistance layer 6.

5a) The low-pressure/low V/III ratio GaN layer is grown under low-pressure and low V/III ratio growth conditions, wherein a growth pressure is 50 Torr, a V/III ratio is 50, and a thickness of the low-pressure/low V/III ratio GaN layer is 50 nm.

5b) The high-pressure/high V/III ratio GaN layer is grown under high-pressure and high V/III ratio growth conditions, wherein a growth pressure is 300 Torr, a V/III ratio is 110, and a thickness of the high-pressure/high V/III ratio GaN layer is 25 nm.

Step 6: The GaN channel layer 8 is epitaxially grown on the GaN superlattice layer 7, wherein a thickness of the GaN channel layer 8 is 300 nm.

Step 7: The AlGaN barrier layer 9 is epitaxially grown on the GaN channel layer 8, wherein a molar content of an Al element in the AlGaN barrier layer 9 is 25% and a thickness of the AlGaN barrier layer 9 is 25 nm.

Step 8. The GaN cap layer 10 is epitaxially grown on the AlGaN barrier layer 9, wherein a thickness of the GaN cap layer 10 is 3 nm.

Comparing embodiment 3 with embodiment 1, the thickness of the GaN superlattice layer in the embodiment 3 has a larger thickness and has a crystal quality better than those in embodiment 1. The half-peak breadth of 002 plane rocking curve of the XRD is 418 arcsec, and the half-peak breadth of the 102 plane rocking curve is 464 arcsec.

The epitaxy is the epitaxial structure of the GaN-based radio frequency device based on the Si substrate. By optimizing the process conditions, on the one hand, the material failure is suppressed, and on the other hand, the film quality is improved. The epitaxy prepared on the large-sized Si substrate has characteristics of high crystal quality, good confinement of the channel carrier, low leakage current. The device prepared by the epitaxial structure of the present invention has high breakdown voltage, high current density, low off-state leakage, and excellent pinch-off characteristics, and has small performance degradation at high temperature. The epitaxial structure of the GaN-based radio frequency device based on the Si substrate has a simple manufacturing process and good repeatability, and is suitable for high-frequency, high-power wireless communication, radar and other applications.

The epitaxial structure of the present invention has characteristics of high crystal quality, good confinement of the channel carrier, low leakage current, through the structure of GaN:Fe/GaN high-resistance layer and GaN superlattice layer. Compared with the existing epitaxial structure, the device prepared by the epitaxial structure of the present invention has high breakdown voltage, high current density, low off-state leakage, and excellent pinch-off characteristics, and has small performance degradation at high temperature.

The embodiment described above is merely preferred embodiment of the present invention, and are not intended to limit the scope of the present invention. It is obvious to those skilled in the art that various modifications and changes in form and detail can be made to the present invention without departing from the principles and scope of the present invention, after understanding the contents and principles of the present invention. However, such modifications and changes based on the present invention still fall within the scope of the claims of the present invention.

What is claimed is:

1. An epitaxial structure of a GaN-based radio frequency device based on a Si substrate, wherein the epitaxial structure of the GaN-based radio frequency device is composed of a Si substrate, an AlN nucleation layer, an AlGaN buffer layer, a GaN: Fe/GaN high-resistance layer, a GaN superlattice layer, a GaN channel layer, an AlGaN barrier layer and a GaN cap layer which are stacked in turn from bottom to top; wherein the GaN: Fe/GaN high-resistance layer is composed of an intentional Fe-doped GaN layer and an unintentional doped GaN layer which are alternately connected; each of the intentional Fe-doped GaN layer and the unintentional doped GaN layer has a thickness of 100 nm to 200 nm; the GaN superlattice layer is composed of a low-pressure/low V/III ratio GaN layer and a high-pressure/high V/III ratio GaN layer which are periodically and alternately connected, and each of the low-pressure/low V/III ratio GaN layer and the high-pressure/high V/III ratio GaN layer has a thickness of 20 nm to 50 nm.

2. The epitaxial structure of the GaN-based radio frequency device based on the Si substrate according to claim 1, wherein a repetition period of the low-pressure/low V/III ratio GaN layer and the high-pressure/high VIII ratio GaN layer is 3-5 cycles.

3. The epitaxial structure of the GaN-based radio frequency device based on the Si substrate according to claim 1, wherein a repetition period of the intentional Fe-doped GaN layer and the unintentional doped GaN layer is 3 to 5 cycles, and a doping concentration of Fe impurities in the intentional Fe-doped GaN layer is $1E19$ $cm^{-3}$-$1E20$ $cm^{-3}$.

4. The epitaxial structure of the GaN-based radio frequency device based on the Si substrate according to claim 1, wherein the AlGaN buffer layer has a total of three layers, wherein a molar content percentage of an Al element of each of the three layers from bottom to top decreases in turn, and is in the range of 20% to 70%; a thickness of each of the three layers increases in turn, and is in the range of 200 nm to 800 nm.

5. The epitaxial structure of the GaN-based radio frequency device based on the Si substrate according to claim 1, wherein the Si substrate has a circular shape and a diameter of 6 inches to 10 inches.

6. The epitaxial structure of the GaN-based radio frequency device based on the Si substrate according to claim 1, wherein a thickness of the Si substrate, a thickness of the AlN nucleation layer, a thickness of the AlGaN buffer layer, a thickness of the GaN channel layer, a thickness of the AlGaN barrier layer and a thickness of the GaN cap layer are respectively 0.5 mm to 2 mm, 0.2 μm to 1 μm, 600 nm to 2400 nm, 100 nm to 500 nm, 10 nm to 30 nm and 2 nm to 5 nm.

7. A method of manufacturing the epitaxial structure of the GaN-based radio frequency device based on the Si substrate according to claim 1, comprising the steps of:
 1) putting the Si substrate into a metal organic chemical vapor deposition equipment, and annealing a surface of the Si substrate in a reaction chamber;
 2) epitaxially growing the AlN nucleation layer on the substrate;
 3) epitaxially growing the AlGaN buffer layers on the basis of the AlN nucleation layer, wherein the AlGaN buffer layers have a total of three layers, wherein a molar content percentage of an Al element of each of the three layers from bottom to top decreases in turn, and is in the range of 20% to 70%; a thickness of each of the three layers increases in turn, and is in the range of 200 nm to 800 nm;
 4) repeating the following steps 4a) and 4b) multiple times to epitaxially growing the GaN: Fe/GaN high-resistance layer on the basis of the AlGaN buffer layers;
 4a) using $Cp_2Fe$ as a Fe doping source to grow the intentional Fe-doped GaN layer, a doping concentration of Fe impurities in the intentional Fe-doped GaN layer is $1E19\ cm^{-3}$-$1E20\ cm^{-3}$, and a thickness of the intentional Fe-doped GaN layer is 100 nm to 200 nm;
 4b) growing the unintentional doped GaN layer on the intentional Fe-doped GaN layer, without introducing $Cp_2Fe$, wherein a thickness of the unintentional doped GaN layer is 100 nm to 200 nm;
 5) repeating the following steps 5a) and 5b) multiple times, and epitaxially growing the GaN superlattice layer on the GaN: Fe/GaN high-resistance layer;
 5a) growing the low-pressure/low V/III ratio GaN layer under low-pressure and low VIII ratio growth conditions, wherein a growth pressure is 50 Torr to 100 Torr, a V/III ratio is lesser than 50, and a thickness of the low-pressure/low V/III ratio GaN layer is 20 nm to 50 nm;
 5b) growing a high-pressure/high V/III ratio GaN layer under high-pressure and high VIII ratio growth conditions, wherein a growth pressure is 300 Torr to 400 Torr, a V/III ratio is greater than 110, and a thickness of the high-pressure/high V/III ratio GaN layer is 20 nm to 50 nm;
 6) epitaxially growing the GaN channel layer;
 7) epitaxially growing the AlGaN barrier layer;
 8) epitaxially growing the GaN cap layer.

8. The method of manufacturing the epitaxial structure of the GaN-based radio frequency device based on the Si substrate according to claim 7, wherein a temperature of the annealing process in step 1) is higher than 1100 degrees Celsius and a time of the annealing process in step 1) is longer than 10 minutes.

9. The method of manufacturing the epitaxial structure of the GaN-based radio frequency device based on the Si substrate according to claim 7, wherein the AlN nucleation layer in step 2) provides a nucleation node for subsequent growth, and a temperature is higher than 1200 degrees Celsius.

10. The method of manufacturing the epitaxial structure of the GaN-based radio frequency device based on the Si substrate according to claim 7, wherein a molar content percentage of an Al element in the AlGaN barrier layer in step 7) is 20% to 30%.

* * * * *